US009699905B2

(12) United States Patent
Nishida et al.

(10) Patent No.: US 9,699,905 B2
(45) Date of Patent: Jul. 4, 2017

(54) WIRING BOARD

(71) Applicant: NGK SPARK PLUG CO., LTD., Nagoya, Aichi (JP)

(72) Inventors: Tomohiro Nishida, Mizuho (JP); Makoto Wakazono, Niwa-gun (JP); Seiji Mori, Kounan (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 259 days.

(21) Appl. No.: 14/236,038

(22) PCT Filed: Jul. 12, 2013

(86) PCT No.: PCT/JP2013/004304
§ 371 (c)(1),
(2) Date: Jan. 29, 2014

(87) PCT Pub. No.: WO2014/024381
PCT Pub. Date: Feb. 13, 2014

(65) Prior Publication Data
US 2015/0334837 A1 Nov. 19, 2015

(30) Foreign Application Priority Data
Aug. 9, 2012 (JP) .................................. 2012-177397

(51) Int. Cl.
*H05K 1/18* (2006.01)
*H05K 3/28* (2006.01)
(Continued)

(52) U.S. Cl.
CPC ............ *H05K 1/181* (2013.01); *H01L 23/498* (2013.01); *H05K 3/28* (2013.01); *H05K 3/4007* (2013.01);
(Continued)

(58) Field of Classification Search
CPC ........ H05K 3/28; H05K 3/185; H05K 3/3436; H05K 3/4007; H05K 3/4602; H05K 1/113;
(Continued)

(56) References Cited

U.S. PATENT DOCUMENTS 5,672,260 A * 9/1997 Carey .................... C25D 5/022
205/118
6,228,466 B1 * 5/2001 Tsukada ............ H01L 23/49816
174/255
(Continued)

FOREIGN PATENT DOCUMENTS

EP         1304740 A2    4/2003
JP         11-54896 A    2/1999
(Continued)

OTHER PUBLICATIONS

Taiwan Intellectual Patent Office, Notification for the Opinion of Examination issued in corresponding Tiawanese Patent Application No. 102127929, mailing date: Jun. 16, 2015.
(Continued)

*Primary Examiner* — Ishwarbhai B Patel
*Assistant Examiner* — Paresh Paghadal
(74) *Attorney, Agent, or Firm* — Stites & Harbison, PLLC; Jeffrey A. Haeberlin; James R. Hayne

(57) ABSTRACT

To provide a wiring board ensuring adhesion strength of a connecting terminal to reduce the connecting terminal from being fallen over or peeled off under fabrication process. The wiring board according to the present invention includes a laminated body where one or more layer of each of an insulating layer and a conductor layer are laminated. The wiring board includes a plurality of connecting terminals formed separately from one another on the laminated body and a filling member filled up between the plurality of
(Continued)

connecting terminals. The filling member is filled up to a position lower than a height of the plurality of connecting terminals. The connecting terminals has a cross section with a trapezoidal shape where a width of a first principal surface on a side contacting the laminated body is wider than a width of a second principal surface facing the first principal surface.

4 Claims, 15 Drawing Sheets

(51) Int. Cl.
    *H05K 3/40*      (2006.01)
    *H01L 23/498*    (2006.01)
    *H05K 1/11*      (2006.01)
    *H05K 3/34*      (2006.01)
    *H05K 3/46*      (2006.01)

(52) U.S. Cl.
    CPC    *H01L 23/49822* (2013.01); *H01L 2924/0002* (2013.01); *H05K 1/113* (2013.01); *H05K 3/3436* (2013.01); *H05K 3/4602* (2013.01); *H05K 2201/098* (2013.01); *H05K 2201/09672* (2013.01); *H05K 2201/2072* (2013.01); *H05K 2203/0597* (2013.01)

(58) Field of Classification Search
    CPC ............ H05K 1/181; H05K 2201/098; H05K 2201/2072; H05K 2201/09672; H05K 2203/0597; H01L 2924/01013; H01L 2924/01029; H01L 2924/01033; H01L 2924/01049; H01L 2924/01079; H01L 2924/01082; H01L 23/498; H01L 23/49822
    See application file for complete search history.

(56) References Cited

U.S. PATENT DOCUMENTS

| | | | |
|---|---|---|---|
| 6,809,415 | B2* | 10/2004 | Tsukada ............... H05K 3/3452 174/257 |
| 2005/0258551 | A1* | 11/2005 | Ho ..................... H01L 23/49816 257/786 |
| 2006/0204650 | A1 | 9/2006 | Hu |
| 2008/0054462 | A1 | 3/2008 | Kim et al. |
| 2008/0149379 | A1* | 6/2008 | Nagase ............... H01L 23/5389 174/260 |
| 2008/0202803 | A1* | 8/2008 | Nagase ............... H01L 23/3121 174/262 |
| 2009/0050353 | A1* | 2/2009 | Hashimoto ............ H05K 3/325 174/254 |
| 2009/0183901 | A1 | 7/2009 | Kataoka et al. |
| 2011/0316170 | A1* | 12/2011 | Muramatsu ....... H01L 23/49816 257/774 |
| 2013/0235535 | A1 | 9/2013 | Isebo |

FOREIGN PATENT DOCUMENTS

| | | |
|---|---|---|
| JP | 2002353593 A | 12/2002 |
| JP | 2005-166917 A | 6/2005 |
| JP | 2006196656 A | 7/2006 |
| JP | 2006-216842 A | 8/2006 |
| JP | 2009-049225 A | 6/2007 |
| JP | 2011-192692 A | 9/2011 |
| JP | 2012-009586 A | 1/2012 |
| KR | 10-1018161 B1 | 2/2011 |
| TW | 200719459 A | 5/2007 |
| WO | 2012/056883 A1 | 5/2012 |

OTHER PUBLICATIONS

Korean Industrial Property Office, Notification of Provisional Refusal, issued in corresponding Korean Patent Application No. 10-2014-7001897, issued Dec. 8, 2014.

European Patent Office, Extended European Search Report issued in corresponding Application No. EP13821782, mailing date May 25, 2016.

* cited by examiner (a)

(b)

(a)

(b)

(a)

(b)

(a)

(b)

(a)

(b)

(a)

(b)

(a)

(b)

(a)

(b)

WIRING BOARD

TECHNICAL FIELD

The present invention relates to a wiring board that includes a plurality of connecting terminals on a principal surface for connecting to a semiconductor chip.

BACKGROUND ART

Usually, a terminal for connection to a semiconductor chip (hereinafter referred to as a connecting terminal) is formed on a principal surface (front face) of a wiring board. Nowadays, the density of the connecting terminals has been becoming high, and therefore the distance (pitch) of the arranged connecting terminals has been narrow. In view of this, a wiring board adopting a Non-Solder Mask Defined (NSMD) shape where a plurality of connecting terminals is disposed in the same opening of a solder resist has been proposed.

However, in the ease where the plurality of connecting terminals are disposed at narrow pitches in the same opening, a solder coated on the surface of the connecting terminal possibly flows out to adjacent connecting terminals, resulting in a short between the connecting terminals. Since the connecting terminals are disposed at high density, the wiring widths of the connecting terminals become narrow. Accordingly, there is a possibility that the connecting terminals cannot obtain sufficient adhesion strength. In this case, the connecting terminal may be fallen over or peeled of under fabrication process.

Therefore, filling up between each connecting terminal with an insulating solder resist has been proposed (see, for example, Patent Document 1). With the method, since the solder resist is filled up between the connecting terminals, outflow of the solder coated on the surface of the connecting terminal to the neighboring connecting terminals is reduced. Since the side surface of the connecting terminal contacts the solder resist, the connecting terminal that is fallen over or peeled off is reduced.

CITATION LIST

Patent Literature

Patent Document 1: JP-A-2011-192692

DISCLOSURE OF THE INVENTION

Problems to be Solved by the Invention

However, with the method proposed in Patent Document 1, the connecting terminal may be fallen over or peeled off under fabrication process until the solder resist is filled up between the connecting terminals. The present invention has been made to solve the above-described circumstances. The present invention aims to provide a wiring board that ensures adhesion strength of the connecting terminals to reduce the connecting terminal from being fallen over or peeled off under fabrication process.

Solutions to the Problems

To achieve the above-described object, the present invention provides a wiring board with a laminated body where one or more layer of each of an insulating layer and a conductor layer are laminated. The wiring board includes a plurality of connecting terminals formed separately from one another on the laminated body, a filling member filled up between the plurality of connecting terminals. The filling member is filled up to a position lower than a height of the plurality of connecting terminals. The connecting terminal has a cross section with a trapezoidal shape where a width of a first principal surface on a side contacting the laminated body is wider than a width of a second principal surface facing the first principal surface.

According to the present in the wiring board with a laminated body where one or ore layer of each of an insulating layer and a conductor layer are laminated, the cross sections of the connecting tern-finals, which are formed separately from one another on the laminated body, has a trapezoidal shape where the width of the first principal surface on the side contacting the laminated body is wider than the width of the second principal surface facing the first principal surface. This ensures a large area of the connecting terminal contacting the laminated body to obtain sufficient adhesion strength. As a result, this reduces the connecting terminal from being fallen over or peeled off under fabrication process.

The trapezoidal cross sectional shape of the connecting terminal inhibits generation of a void between the connecting terminal and the filling member. Furthermore, the width of the second principal surface of the connecting terminal is narrow. This inhibits the solder coated on the surface of the connecting terminal to flow out to adjacent connecting terminals and inhibits causing a short circuit between the connecting terminals.

According to one aspect of the present invention, the connecting terminal has the first principal surface that includes a contact surface and spaced surfaces. The contact surface contacts the laminated body. The spaced surfaces are disposed on both ends of the contact surface and not in contact with the laminated body.

According to another aspect of the present invention, the contact surface has a width wider than a width of the second principal surface. Since the width of the contact surface is wider than the width of the second principal surface, this ensures sufficient adhesion strength. This reduces the connecting terminal from being fallen over or peeled off under fabrication process.

According to another aspect of the present invention, the filling member functions as a solder resist. The filling member that functions as the solder resist reduces a solder from remaining on the filling member, thus reducing a short circuit between the connecting terminals.

According to another aspect of the present invention, a solder resist layer is provided on the laminate body. The solder resist layer has openings that expose the plurality of connecting terminals. The solder resist layer covers a wiring pattern connected to the plurality of connecting terminals. The wiring pattern has a cross section with a trapezoidal shape where a width of a third principal surface on a side contacting the laminated body is wider than a width of a fourth principal surface facing the third principal surface. At least a part of the plurality of connecting terminals has a ratio of a width of the first principal surface with respect to a width of the second principal surface larger than a ratio of width of the third principal surface with respect to a width of the fourth principal surface of the wiring pattern.

With the configuration described above, the width of the second principal surface of the connecting terminal becomes narrow. Thus a distance between the connecting terminals is lengthened. In view of this, a short circuit between the connecting terminals can be further efficiently inhibited.

Since the width of the fourth principal surface of the wiring pattern becomes large, the cross sectional area of the wiring becomes large. This ensures a low electrical resistance of the wiring pattern.

Effects of the Invention

As described above, with the present invention, a wiring board that ensures adhesion strength of the connecting terminal to reduce the connecting terminal from being fallen over or peeled off under fabrication process can be provided.

DESCRIPTION OF EMBODIMENTS

Hereinafter, embodiments of the present invention will be described in detail with reference to the drawings. The following describes the embodiments of the present invention with an exemplary wiring board where a buildup layer is formed on a core substrate. However, the wiring board is only necessary to include a plurality of connecting terminals whose top surface and the side surfaces are exposed. The wiring board may be, for example, formed without a core substrate.

(First Embodiment)

Figure 1:
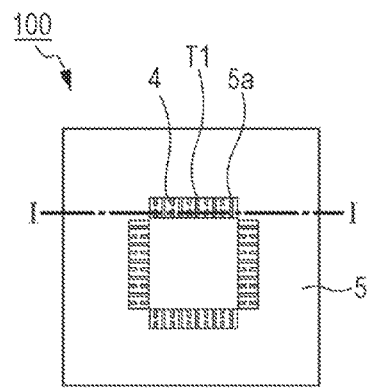
FIG. 1 is a top view (front face side) of a wiring board according to a first embodiment.
Figure 2:
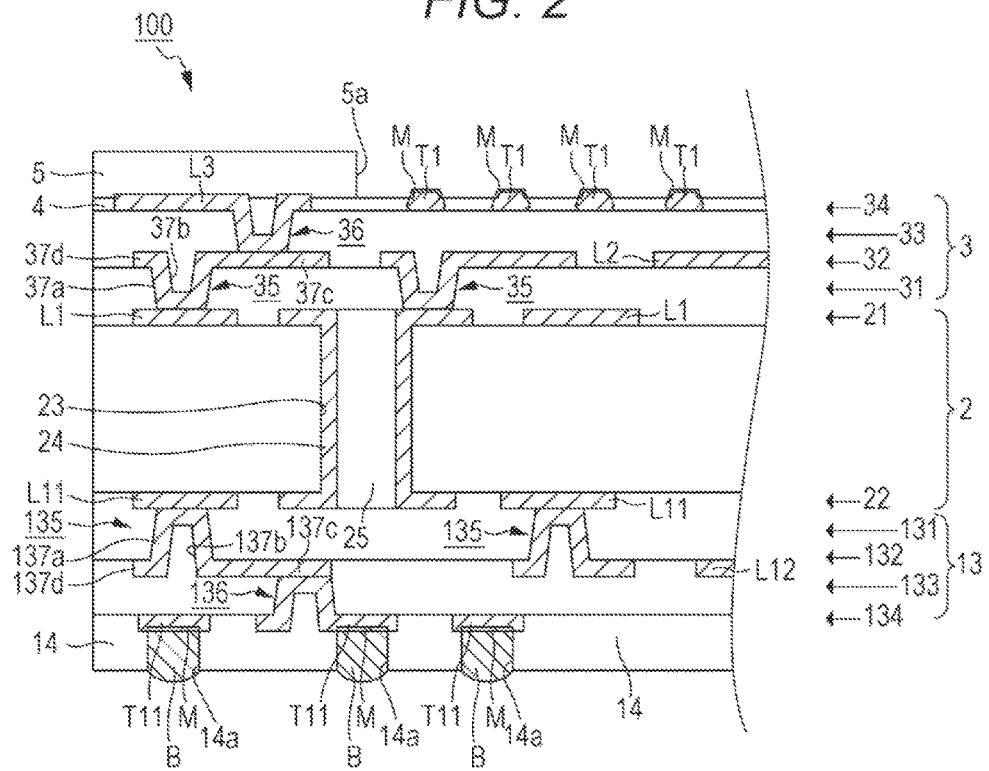
FIG. 2 is a partial sectional view of the wiring board according to the first embodiment.
Figure 3:
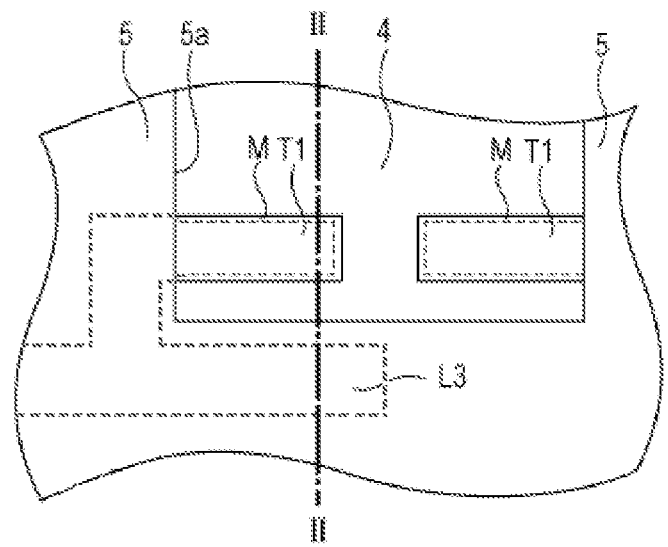
FIG. 3 is a configuration diagram of a connecting terminal on the front face side of the wiring board according to the first embodiment.
Figure 3:
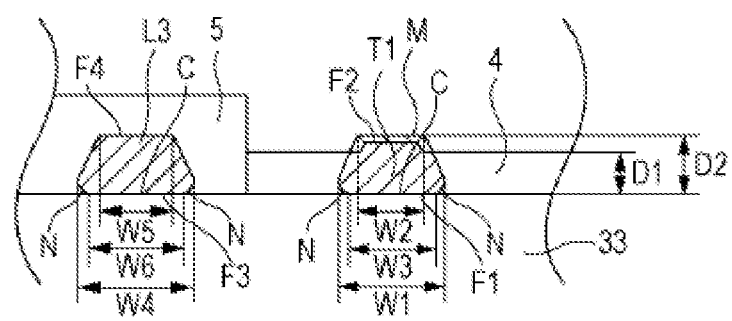

FIG. 1 is a top view (front face side) of a wiring board 100 according to a first embodiment. FIG. 2 is a partial sectional view of the wiring board 100 taken along the line I-I of FIG. 1. FIG. 3 is a configuration diagram of connecting terminals T1 and a metal wiring L3 (wiring pattern) on the front face side of the wiring board 100. FIG. 3A is a top view. FIG. 3B is a sectional view taken along the line II-II of FIG. 3A. In the following description, a side to which a semiconductor chip is connected is referred to as a front face side while a side to which a motherboard, a socket, or a similar member (hereinafter referred to as a motherboard or a similar member) is connected is referred to as a reverse face side. The connecting terminal T1 and the metal wiring L3 constitute a conductor layer 34.

(Configuration of Wiring Board 100)

The wiring board 100 illustrated in FIG. 1 to FIG. 3 includes a core substrate 2, a buildup layer 3 (front face side), a filling member 4, a solder resist layer 5, a buildup layer 13 (reverse face side), and a solder resist layer 14. The buildup layer 3 includes the plurality of connecting terminals T1 for connection to a semiconductor chip (not shown). The buildup layer 3 is laminated on the front face side of the core substrate 2. The filling member 4 is laminated on the front surface side of the buildup layer 3. The filling member 4 fills up between the plurality of connecting terminals T1. The solder resist layer 5 is laminated on the front surface side of the filling member 4. The solder resist layer 5 includes an opening 5a to expose the plurality of connecting terminals T1. The buildup layer 13 includes a plurality of connecting terminals T11 for connection to a motherboard or a similar member (not shown). The buildup layer 13 is laminated on the reverse face side of the core substrate 2. The solder resist layer 14 is laminated on the reverse face side of the buildup layer 13. The solder resist layer 14 includes an opening 14a to at least partially expose the connecting terminal T11.

The core substrate 2 is a plate-shaped substrate made of resin. The core substrate 2 is constituted of a heat-resistant resin plate (for example, a bismaleimide-triazine resin plate), a fiber reinforced resin plate (for example, a glass fiber reinforced epoxy resin), or a similar plate. The core substrate 2 includes core conductor layers 21 and 22, which form metal wirings L1 and L11, on the respective front face and reverse face. The core substrate 2 includes a through-hole 23 drilled by a drill or similar tool. A through-hole conductor 24 is formed on the inner wall surface of the through-hole 23. The through-hole conductor 24 conducts the core conductor layers 21 and 22 to one another. Furthermore, the through-hole 23 is filled up with a resin-made plug 25 made of resin such as epoxy resin.

(Configuration at Front Face Side)

The buildup layer 3 includes resin insulating layers 31 and 33 and conductor layers 32 and 34 laminated on the front face side of the core substrate 2. The resin insulating layer 31 is made of thermosetting resin composition. The conductor layer 32 is formed on the surface of the resin insulating layer 31. The conductor layer 32 forms a metal wiring L2. A via 35 that electrically connects the core conductor layer 21 and the conductor layer 32 is formed in the e resin insulating layer 31. The resin insulating layer 33 is made of thermosetting resin composition. The conductor layer 34 is formed on the surface layer of the resin insulating layer 33. The conductor layer 34 includes the plurality of connecting terminals T1. A via 36 that electrically connects the conductor layer 32 and the conductor layer 34 is formed in the insulating layer 33. Here, the resin insulating layers 31 and 33 and the conductor layer 32 constitute a laminated body.

The vias 35 and 36 include a via hole 37a, a via conductor 37b, a via pad 37c, and a via land 37d. The via conductor 37b is disposed on the inner peripheral surface of the via hole 37a. The via pad 37c is disposed so as to be conducted with the via conductor 37b at the bottom surface side. The via land 37d is disposed on the opposite side of the via pad 37c. The via land 37d outwardly projects from the opening peripheral edge of the via conductor 37b.

The connecting terminal T1 is a connecting terminal for connection to the semiconductor chip. The connecting terminal T1 is a so-called peripheral connecting terminal disposed along the inner peripheral of the mounting region for the semiconductor chip. By electrical connection with the connecting terminal T1, the semiconductor chip is mounted on the wiring board 100. Each connecting terminal T1 has a rough surface to improve an adhesive property with the filling member 4, which will be described below.

As illustrated in FIG. 3, the cross section of each connecting terminal T1 has a trapezoidal shape where a width W1 wider than a width W2. The width W1 is a width of a first principal surface F1 on the side contacting a laminated body constituted by the resin insulating layers 31 and 33 and the conductor layer 32. The width W2 is a width of a second principal surface F2 facing the first principal surface F1. The first principal surface F1 of the connecting terminal T1 includes a contact surface C, which contacts the laminated body, and spaced surfaces N. The spaced surfaces N are disposed at both ends of the contact surface C and do not contact the laminated body. A width W3 of the contact surface C is wider than the width W2 of the second principal surface F2.

The metal wiring L3 (wiring pattern) is covered with the solder resist layer 5. The cross section of the metal wiring L3 (wiring pattern) has a trapezoidal shape where a width W4 is wider than a width W5. The width W4 is a width of a third principal surface F3 on the side contacting the laminated body. The width W5 is a width of a fourth principal surface F4 facing the third principal surface F3. The third principal surface F3 of the metal wiring L3 (wiring pattern) includes the contact surface C, which contacts the laminated body, and spaced surfaces N. The spaced surfaces N are disposed at both ends of the contact surface C and do not contact the laminated body. A width W6 of the contact surface C is wider than the width W5 of the fourth principal surface F4.

Furthermore, in the wiring board 100 of the embodiment, at least a part of the plurality of connecting terminals T1 has a ratio W1/W2 larger than a ratio W4/W5. The ratio W1/W2 is a ratio of the width W1 of the first principal surface F1 with respect to the width W2 of the second principal surface F2. The ratio W4/W5 is a ratio of the width W4 of the third principal surface F3 with respect to the width W5 of the fourth principal surface F4 of the metal wiring L3 (wiring pattern).

The exposed surface of each of the connecting terminals T1 is covered with a metal plating layer M. When mounting the semiconductor chip to the wiring board 100, the connecting terminal of the semiconductor chip and the connecting terminal T1 are connected by reflowing a solder coated on the connecting terminal of the semiconductor chip. The metal plating layer M is constituted of, for example, a single layer selected from metal layers such as a Ni layer, a Sn layer, an Ag layer, a Pd layer, and an Au layer, or a plurality of layers (such as, Ni layer/Au layer, and Ni layer/Pd layer/Au layer).

Instead of the metal plating layer M, a rustproof Organic Solderability Preservative (OSP) process may be performed. A solder may be coated on the exposed surface of the connecting terminal T1. Furthermore, after covering the exposed surface of the connecting terminal T1 with the metal plating layer M, the metal plating layer M may be coated with the solder. A method for coating the solder on the exposed surface of the connecting terminal T1 will be described later.

The filling member 4 is an insulating member laminated on the buildup layer 3. The material of the filling member 4 is preferred to be the same as a material of the solder resist layer 5. The filling member 4 is filled up between the connecting terminals T1 while contacting the side surface of each connecting terminal T1 formed on the surface layer of the buildup layer 3. A thickness D1 of the filling member 4 is thinner than a thickness (height) D2 of the connecting terminal T1.

The solder resist layer 5 covers the wiring pattern connected to the connecting terminal T1 and includes the opening 5a. The opening 5a exposes the connecting terminal T1 disposed along the inner peripheral of the mounting region for the semiconductor chip. The opening 5a of the solder resist layer 5 forms an NSMD shape where the plurality of connecting terminals T1 are disposed in the same opening.

(Configuration of Reverse Face Side)

The buildup layer 13 includes resin insulating layers 131 and 133 and conductor layers 132 and 134 laminated on the reverse face side of the core substrate 2. The resin insulating layer 131 is made of thermosetting resin composition. The conductor layer 132 including a metal wiring L12 is formed on the reverse face of the resin insulating layer 131. A via 135 that electrically connects the core conductor layer 22 and the conductor layer 132 is formed in the resin insulating layer 131. The resin insulating layer 133 is made of thermosetting resin composition. The conductor layer 134 that includes one or more connecting terminal T11 is formed on the surface layer of the resin insulating layer 133. A via 136 that electrically connects the conductor layer 132 and conductor layer 134 is formed in the resin insulating layer 133.

Vias 135 and 136 include a via hole 137a, a via conductor 137b, a via pad 137c, and a via land 137d. The via conductor 137b is disposed at the inner peripheral surface of the via hole 137a. The via pad 137c is disposed so as to be conducted with the via conductor 137b at the bottom surface side. The via land 137d is disposed on the opposite side of the via pad 137c. The via land 137d outwardly projects from the opening peripheral edge of the via conductor 137b.

The connecting terminal T11 is used as a reverse face land (PGA pad, BGA pad) to connect the wiring board 100 to a motherboard or a similar member. The connecting terminal T11 is formed at the outer peripheral region of the wiring board 100 excluding its approximate center portion and arranged in a rectangular shape so as to surround the approximate center portion. At least a part of the surface of the connecting terminal T11 is covered with the metal plating layer M.

The solder resist layer 14 is formed by laminating a film solder resist on the surface of the buildup layer 13. The solder resist layer 14 includes the opening 14a that partially exposes the surface of each connecting terminal T11. In view of this, the surface of each connecting terminal T11 is partially exposed from the solder resist layer 14 by the opening 14a. That is, the opening 14a of the solder resist layer 14 is formed to have a Solder Mask Defined (SMD) shape where the surface of each connecting terminal T11 is partially exposed. Different from the opening 5a of the solder resist layer 5, the opening 14a of the solder resist layer 14 is formed at each connecting terminal T11.

A solder ball B made of a solder, such as Sn—Ag, Sn—Cu, Sn—Ag—Cu, and Sn—Sb that substantially do not contain Pb is formed in the opening 14a. The solder ball B is formed to electrically connect to the connecting terminal T11 via the metal plating layer M. When mounting the wiring board 100 on the motherboard or a similar member, the connecting terminal T11 and the connecting terminal of the motherboard or a similar member are electrically connected by reflowing the solder ball B on the wiring board 100.

(Method for Fabricating Wiring Board)

FIG. 4 to FIG. 10 are process drawings for fabricating the wiring board 100 according to the first embodiment. The following describes methods for fabricating the wiring board 100 with reference to FIG. 4 to FIG. 10.

Figure 4:
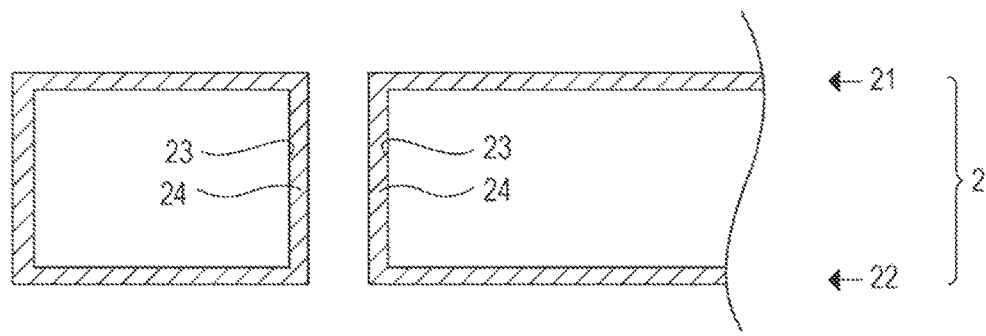
FIG. 4 is process drawing for fabricating the wiring board according to the first embodiment (core substrate process).
Figure 4:
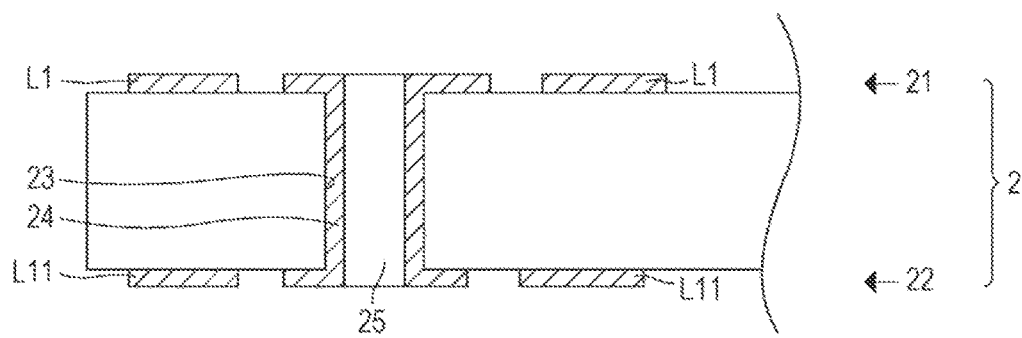

(Core Substrate Process: FIG. 4)

A copper-clad laminate, which includes a plate-shaped substrate made of resin to which copper foils are pasted on the front face and the reverse face, is prepared. The copper-clad laminate is drilled with a drill to preliminarily form a penetration hole, which will be the through-hole 23, at a predetermined position. Then, the through-hole conductor 24 is formed on the inner wall of the through-hole 23 by performing electroless copper plating and electrolytic copper plating in accordance with a conventionally known method. Thus, copper plating layers are formed on both surfaces of the copper-clad laminate (see FIG. 4A).

Afterwards, the inside of the through-hole conductor 24 is filled up with the resin plug 25 such as epoxy resin. Furthermore, the copper plating layer formed on the copper foils of both surfaces of the copper-clad laminate is etched to a desired shape. Thus, the core conductor layers 21 and 22 forming the metal wirings L1 and L11 on the respective front face and reverse face of the copper-clad laminate are formed, thus obtaining the core substrate 2 (see FIG. 4B). After forming the through-hole 23, performing a desmear process, which removes a smear at a processed part, is preferred.

Figure 5:
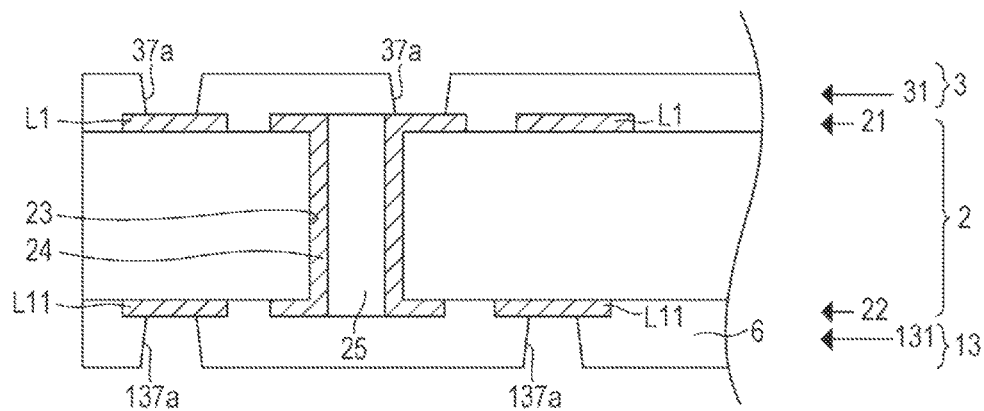
FIG. 5 is a process drawing for fabricating the wiring board according to the first embodiment (buildup process).
Figure 5:
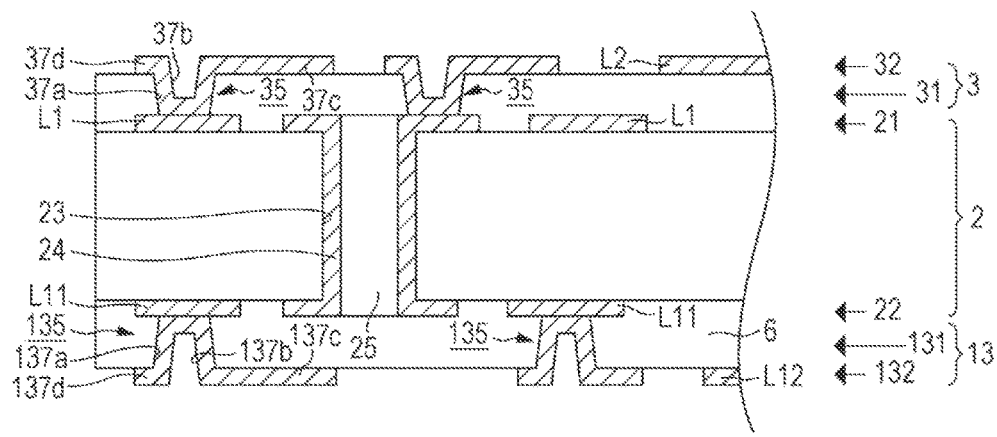
Figure 6:
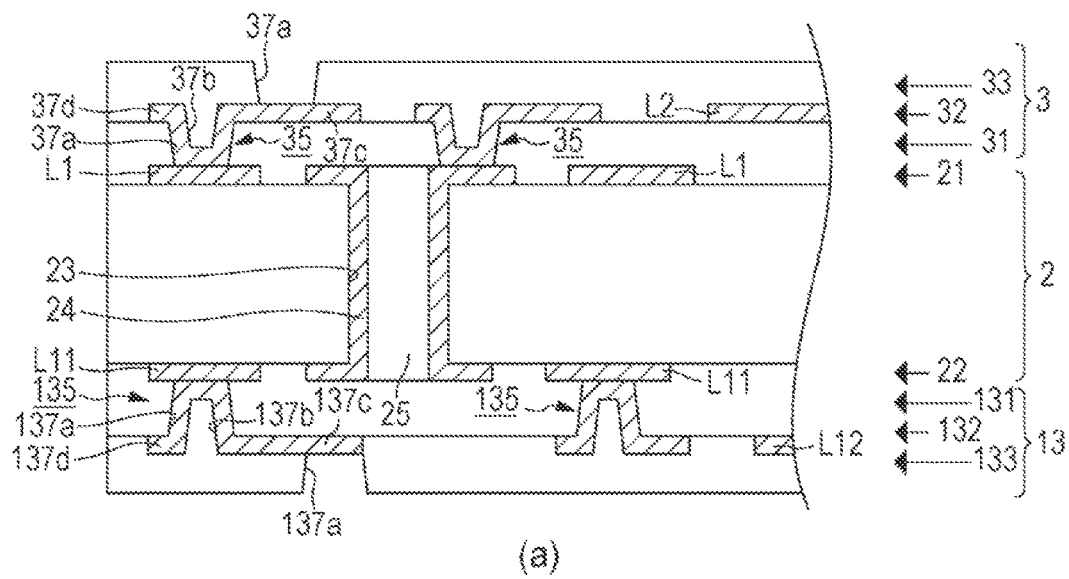
FIG. 6 is a process drawing for fabricating the wiring board according to the first embodiment (buildup process).
Figure 6:
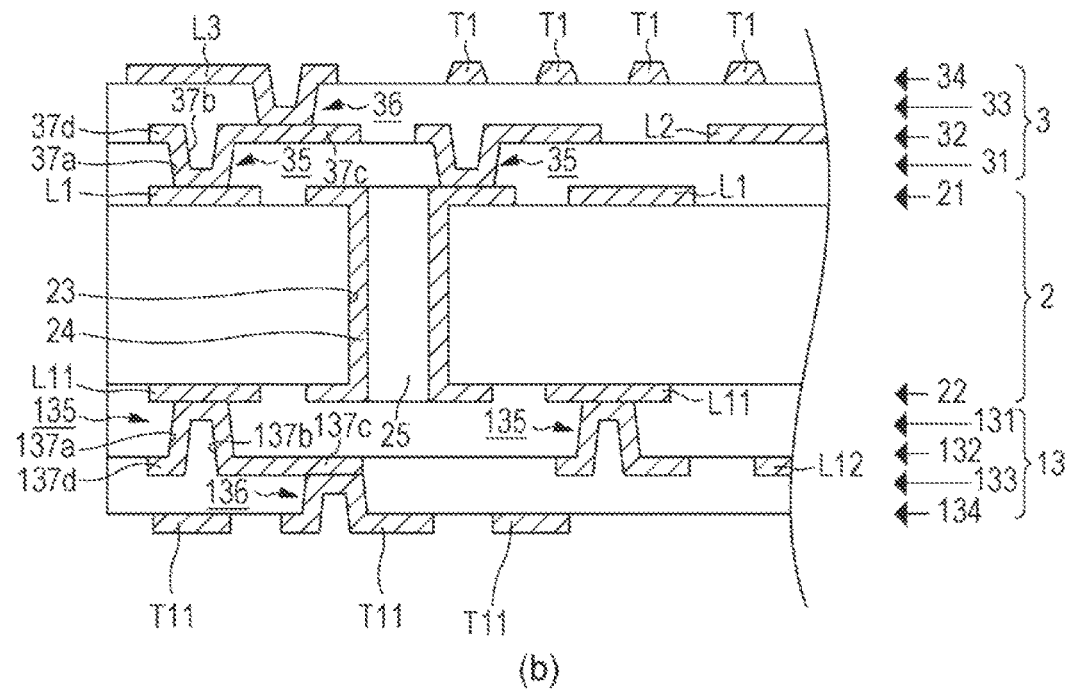

(Buildup Process: FIG. 5 and FIG. 6)

Film insulating resin materials having main constituent of epoxy resin are disposed overlapping with one another on the front face and the reverse face of the core substrate 2 to form resin insulating layers 31 and 131. Then, this laminated product is pressed and heated with a vacuum thermocompression bonding machine, and the film insulating resin materials are press-bonded with heat hardening. Next, laser irradiation is performed using a conventionally well-known laser processing apparatus to form the via holes 37a and 137a at the respective resin insulating layers 31 and 131 (see FIG. 5A).

Subsequently, after roughening the surfaces of the resin insulating layers 31 and 131, electroless copper plating is performed to form electroless copper plating layers on the resin insulating layers 31 and 131 including the inner walls of the via holes 37a and 137a, Next, a photoresist is laminated on the electroless copper plating layers formed on the resin insulating layers 31 and 131 and then is exposed and developed to form a desired-shaped plating resist.

Afterwards, using the plating resist as a mask, the copper is plated by electrolytic plating to obtain a desired copper plating pattern. Next, the plating resist is peeled off and the electroless copper plating layer, which was present under the plating resist, is removed to form the conductor layers 32 and 132 forming the metal wirings L2 and L12. At this time, the vias 35 and 135 including the via conductors 37b and 137b, the via pads 37c and 137c, and the via lands 37d and 137d are formed (see FIG. 5B).

Next, film insulating resin materials having main constituent of epoxy resin are disposed overlapping with one another on the conductor layers 32 and 132 to form the resin insulating layers 33 and 133. Then, this laminated product is pressed and heated with a vacuum thermocompression bonding machine, and the film insulating resin materials are press-bonded with heat hardening. Next, laser irradiation is performed using a conventionally well-known laser processing apparatus to form the via holes 37a and 137a at the respective resin insulating layers 33 and 133 (see FIG. 6A).

Subsequently, similar to formation of the conductor layers 32 and 132, the conductor layers 34 and 134 with connecting terminals T1 and T11 and the vias 36 and 136 are formed on the respective resin insulating layers 33 and 133 with the via holes 37a and 137a (see FIG. 6B).

Before filling up between the connecting terminals T1 with the filling member 4, roughening the surfaces (in particular, side surfaces) of the connecting terminals T1 is preferred. The surfaces of the connecting terminal T1 can be roughened, for example, by processing using etchant, such as MEC-Etch-Bond (manufactured by MEC Company Ltd.). By processing the surface of the connecting terminal T1 with etchant, the cross sections of the connecting terminal T1 and the metal wiring L3 (wiring pattern) become a trapezoidal shape and the spaced surfaces N, which do not contact the resin insulating layer 33, are formed at both ends of the contact surface C, as described with reference to FIG. 3.

Figure 7:
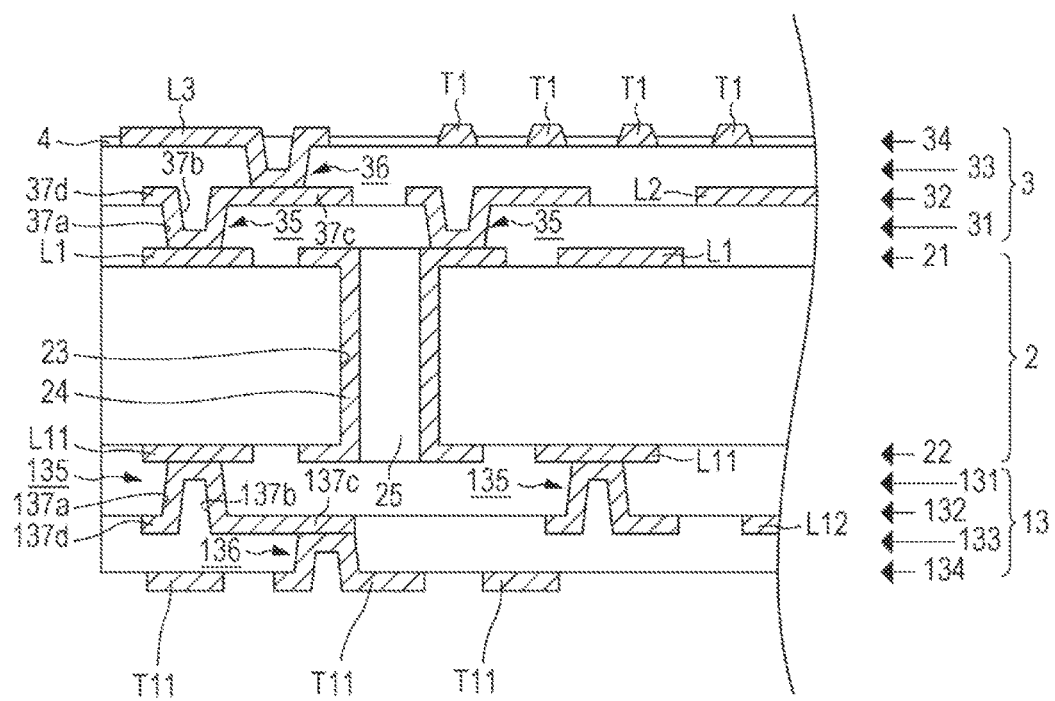
FIG. 7 is a process drawing for fabricating the wiring board according to the first embodiment (filling up process).

(Filling up Process: FIG. 7)

Next, between the plurality of connecting terminals T1, which form the surface layer of the buildup layer 3, is filled up with the filling member 4 up to the position lower than the connecting terminals T1. As a method for filling up the filling member 4 between the connecting terminals T1, various kinds of methods can be adopted. The following describes methods for filling up the filling member 4 between the connecting terminals T1. In the following first to fourth filling up methods, various kinds of methods, such as printing, lamination, roll coat, and spin coat, are available as a method for coating the insulating resin, which will be the filling member 4.

(First Filling Up Method)

The first filling up method thinly coats a thermosetting insulating resin on the surface of the buildup layer 3 including the connecting terminal T1 on the surface layer, performs heat hardening, and then polishes the hardened insulating resin until being lower than the top surface of the connecting terminals T1. In removal of the filling member 4 by polishing, it is noted that the filling member 4 should not be removed to the extent that the surface of the resin insulating layer 33, which is a foundation layer, is exposed.

(Second Filling Up method)

The second filling up method coats a thermosetting insulating resin on the surface of the buildup layer 3 including the connecting terminal T1 on the surface layer, removes extra insulating resin covering the top surface of the connecting terminals T1 with solvent that melts the insulating resin, and then performs heat hardening on the insulating resin. It is noted that the filling member 4 should not be removed to the extent that the surface of the resin insulating layer 33, which is a foundation layer, is exposed.

(Third Filling Up Method)

The third filling up method thickly coats a thermosetting insulating resin on the surface of the buildup layer 3 with the connecting terminal T1 on the surface layer, performs heat hardening, masks the region other than the mounting region for the semiconductor device, and then dry-etches the insulating resin by, for example. Reactive Ion Etching (RIE) until being lower than the top surface of the connecting terminals T1. When the filling member 4 is filled up between the connecting terminals T1 by the third filling up method, the filling member 4 and the solder resist layer 5 are integrally formed. It is noted that the filling member 4 should not be removed to the extent that the surface of the resin insulating layer 33 which is a foundation layer, is exposed.

(Fourth Filling Up Method)

Figure 8:
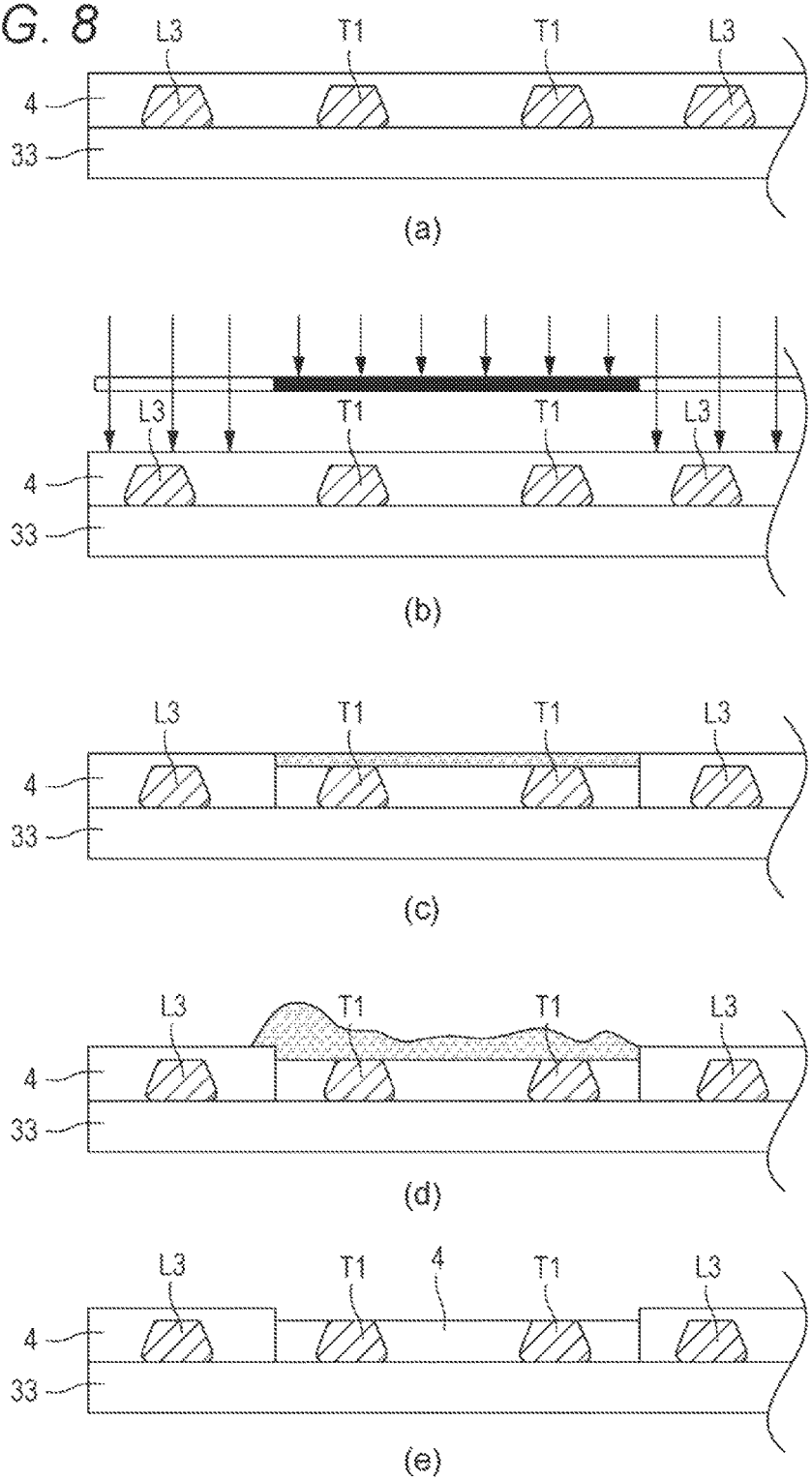
FIG. 8 is an explanatory view of a fourth filling up method.

FIG. 8 is an explanatory view of a fourth filling up method. The following describes the fourth filling up method with reference to FIG. 8. The fourth filling up method thickly coats a photocurable insulating resin on the surface of the buildup layer 3 including the wiring conductor T1 on the surface layer (see FIG. 8A), masks the inner region of the region, which will be the opening 5a of the solder resist layer later, and exposes and develops the insulating resin. Thus, the insulating resin, which will be the outer region of the opening 5a, is photo-cured (see FIG. 8B). Next, the wiring board 100 under fabrication is immersed in a sodium carbonate solution (concentration: 1 weight %) for a short period (period to the extent that the insulating-resin surface of the unexposed portion is slightly swelled) (see FIG. 8C).

Afterwards, the insulating resin swelled is emulsified by water washing (see FIG. 8D). Next, the swelled and emulsified insulating resin is removed from the wiring board 100 under fabrication (see FIG. 8E). The immersion and the water washing are performed by one time respectively or repeated by several times respectively until the upper end position of the insulating resin that has not been photo-cured is positioned lower than the top surface of each connecting terminal T1. Then, the insulating resin is hardened by heat or ultraviolet rays.

It is noted that the filling member 4 should not be removed to the extent that he surface of the resin insulating layer 33, which is a foundation layer, is exposed. When the filling member 4 is filled up between the connecting terminals T1 by the fourth filling up method, the filling member 4 and the solder resist layer 5 are integrally formed.

Figure 9:
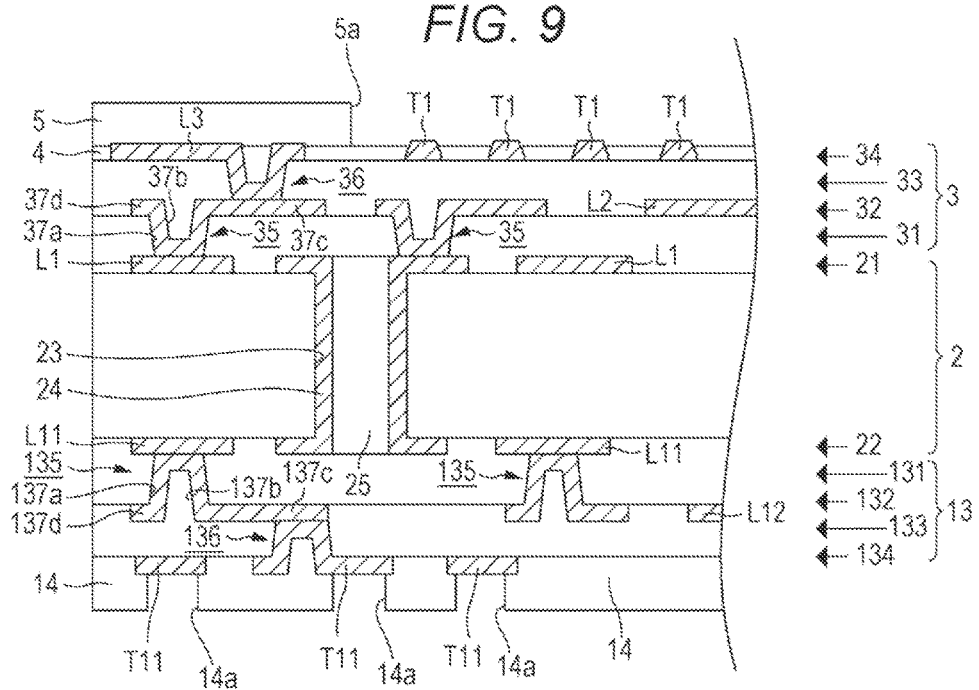
FIG. 9 is a process drawing for fabricating the wiring board according to the first embodiment (solder resist layer process).

(Solder Resist Layer Process: FIG. 9)

Film solder resists are pressed and laminated on the surfaces of the filling member 4 and the conductor layer 134. The laminated film solder resists are exposed and developed to obtain the solder resist layer S with the NSMD-shaped opening 5a and the solder resist layer 14 with the SMD-shaped opening 14a. The opening 5a exposes the surface and the side surfaces of the plurality of connecting terminals T1 while the opening 14a exposes a part of the surface of each connecting terminal T11. In the case where the above-described third and fourth filling up methods are adopted in the filling up process, since the filling member 4 and the solder resist layer 5 are integrally formed, the solder resist layer 5 does not have to be laminated at the process.

Figure 10:
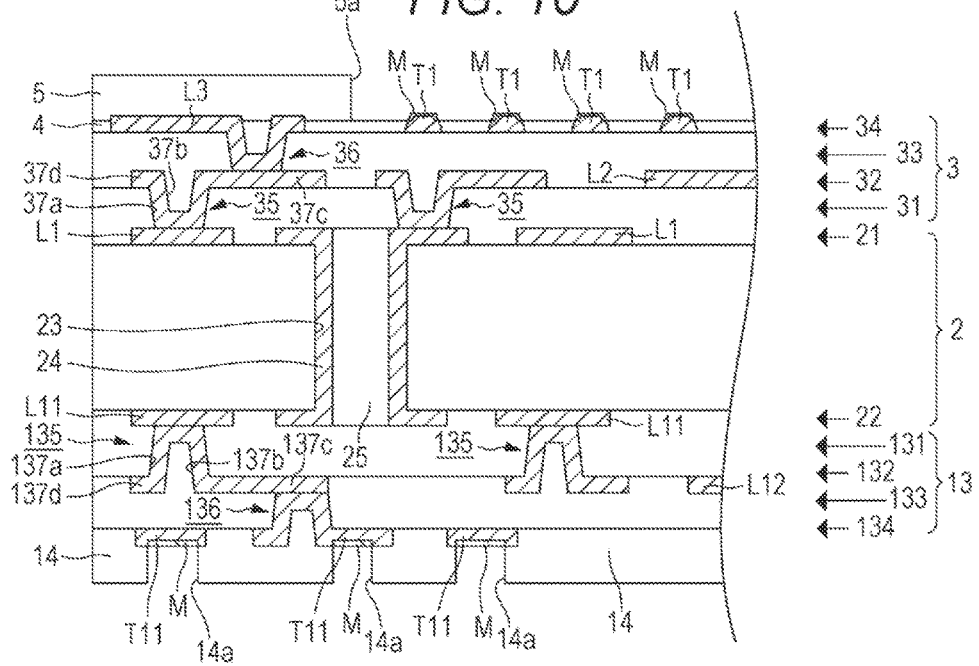
FIG. 10 is a process drawing for fabricating the wiring board according to the first embodiment (plating process).

(Plating Process: FIG. 10)

Next, the exposed surface of the connecting terminal T1 is etched using, for example, sodium persulfate to remove impurities, for example, an oxide film on the surface of the connecting terminal T1. A step is formed around the principal surface (outer periphery) of the connecting terminal T1 by ething. Afterwards, the metal plating layers M is formed on the exposed surfaces of the connecting terminals T1 and T11 by performing electroless reduction plating using a reduction agent. In the case where the metal plating layer M is formed on the exposed surface of the connecting terminal T1 by the electroless substitution plating, the metal on the exposed surface of the connecting terminal T1 is substituted, thus forming the metal plating layer M. In view of this, even if the exposed surface of the connecting terminal T1 is not etched using, for example, sodium persulfate, the step is formed around the principal surface of the connecting terminal T1.

In the case where solder is coated on the exposed surface of the connecting terminal T1, the following two methods can be selected according to the thickness of the solder layer to be coated.

(First Coating Method)

When the solder layer with a thickness of 5 to 30 μm is coated on the exposed surface of the connecting terminal T1, the exposed surface of the connecting terminal T1 is etched little (soft etching) to remove the oxide film formed on the exposed surface of the connecting terminal T1. At this time, the step is formed around the principal surface of the connecting terminal T1. Next, a paste (for example, super solder (product name) of Harima Chemicals Group, Inc.) mixed an ionic compound including a metal, such as tin (Sn) powder, silver (Ag), and copper (Cu), and a flux is thinly applied over the entire inside of the NSMD-shaped opening 5a so as to cover the entire exposed surface of the connecting terminal T1. Afterward, reflow is performed to form a solder layer made of an alloy containing Sn and Ag, or Sn, Ag, and Cu on the exposed surface of the connecting terminal T1.

(Second Coating Method)

When the solder layer with a thickness of equal to or less than 10 μm is coated on the exposed surface of the connecting terminal T1, the exposed surface of the connecting terminal T1 is etched little (soft etching) to remove the oxide film formed at the exposed surface of the connecting terminal T1. At this time, the step is formed around the principal surface of the connecting terminal T1. Next, electroless tin (Sn) plating is performed on the exposed surface of the connecting terminal T1 to form an Sn plating layer, and the flux is applied so as to cover the entire surface of the Sn plating layer. Afterwards, a reflow is performed to melt the Sn plating layer plated on the connecting terminal T1 so as to form the solder layer on the principal surface of the connecting terminal T1. At this time, the melted Sn is condensed to the principal surface of the connecting terminal T1 by surface tension.

(Back-End Process)

After the solder paste is applied over the metal plating layer M formed on the connecting terminal T11 by solder printing, a reflow is performed at a predetermined temperature for a predetermined period, and the solder ball B is formed on the connecting terminal T11, thus the wiring board 100 illustrated in FIG. 1 and FIG. 2 is obtained.

As described above, in the wiring board 100 according to the first embodiment, the cross section of each connecting terminal T1 has a trapezoidal shape where the width W1 is wider than the width W2. The width W1 is the width of the first principal surface F1 on the side co acting the laminated body constituted by the resin insulating layers 31 and 33 and the conductor layer 32. The width W2 is the width of the second principal surface F2 facing the first principal surface F1. The first principal surface F1 of the connecting terminal T1 includes the contact surface C, which contacts the laminated body, and the spaced surfaces N. The spaced surfaces N are disposed at both ends of the contact surface C and do not contact the laminated body. The width W3 of the contact surface C is wider than the width W2 of the second principal surface F2.

In view of this, the area of the connecting terminal T1 contacting the laminated body becomes large, thus ensures to obtain sufficient adhesion strength. This reduces the connecting terminal T1 from being fallen over or peeled off under fabrication process.

The trapezoidal cross sectional shape of the connecting terminal T1 inhibits generation of a void between the connecting terminal T1 and the filling member 4. Furthermore, the width W2 of the second principal surface F2 of the connecting terminal T1 is narrow. This inhibits the solder coated on the surface of the connecting terminal T1 to flow out to adjacent connecting terminals T1 and inhibits a short circuit caused between the connecting terminals T1.

The first principal surface F1 of the connecting terminal T1 includes the contact surface C, which contacts the laminated body, and the spaced surfaces N. The spaced surfaces N are disposed at both ends of the contact surface C and do not contact the laminated body. The width W3 of the co tact surface C is wider than the width W2 of the second principal surface F2. This ensures sufficient adhesion strength. This reduces the connecting terminal from being fallen over or peeled off under fabrication process.

In the wiring board 100 of the embodiment, at least a part of the plurality of connecting terminals T1 has the ratio W1/W2 larger than the ratio W4/W5. The ratio W1/W2 is a ratio of the width W1 of the first principal surface F1 with respect to the width W2 of the second principal surface F2. The ratio W4/W5 is a ratio of the width W4 of the third principal surface F3 with respect to the width W5 of the fourth principal surface F4 of the metal wiring L3 (wiring pattern).

The above-described configuration narrows the width W2 of the second principal surface F2 of the connecting terminal T1, thus a distance between the connecting terminals T1 is lengthened. In view of this, a short circuit between the connecting terminals T1 can be further efficiently inhibited. Since the width W5 of the fourth principal surface F4 of the metal wiring L3 (wiring pattern) becomes large, the cross sectional area of the metal wiring L3 (wiring pattern) becomes large. This ensures a low electrical resistance of the metal wiring L3 (wiring pattern).

Furthermore, since the filling member 4 is filled up between the roughened connecting terminals T1, the adhesion strength between the connecting terminals T1 and the filling member 4 is improved. In view of this, peel-off of the connecting terminal 1 under fabrication process can be further efficiently inhibited. Use of the material same as the material of the solder resist layer 5 for the filling member 4 makes flowability of the solder of the filling member 4 to the same extent as that of the solder resist layer 5. This inhibits the solder from remaining on the filling member 4 and from resulting in a short circuit between the connecting terminals T1.

The thickness D1 of the filling member 4 filled up between the connecting terminals T1 is thinner than the thickness (height) D2 of the connecting terminal T1. That is, the connecting terminal T1 slightly protrudes from the top surface of the filling member 4. In view of this, even if the center of the connecting terminal of the semiconductor chip is misaligned with the center of the connecting terminal T1, the connecting terminal of the semiconductor chip contacts the end portion of the connecting terminal T1, thus connection reliability between the connecting terminal T1 and the connecting terminal of the semiconductor chip is improved.

(Second Embodiment)

Figure 11:
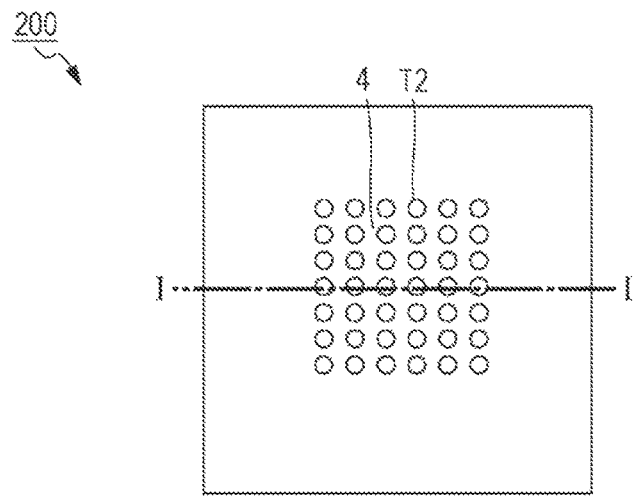
FIG. 11 is a top view (front face side) of a wiring board according to a second embodiment.
Figure 12:
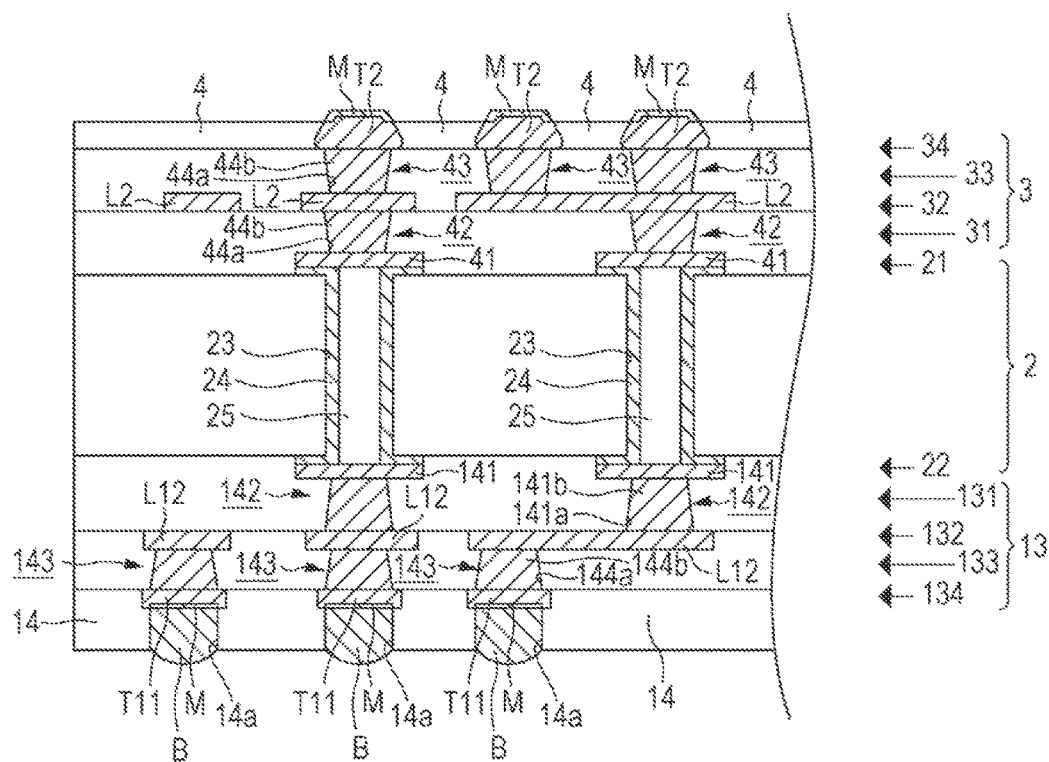
FIG. 12 is a partial sectional view of the wiring board according to the second embodiment.
Figure 13:
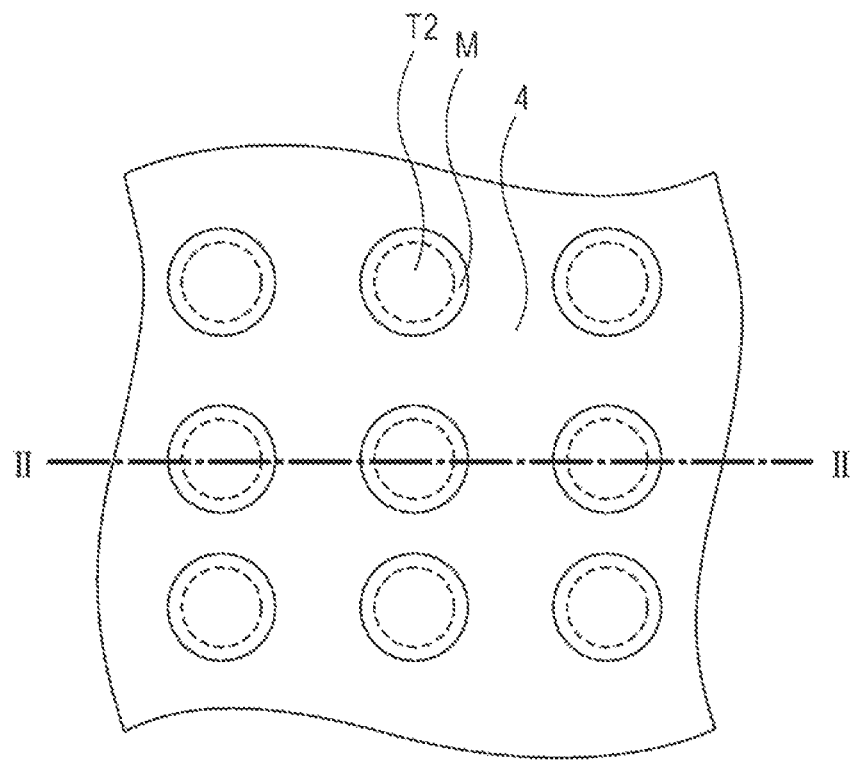
FIG. 13 is a configuration diagram of a connecting terminal on the front face side of the wiring board according to the second embodiment.
Figure 13:
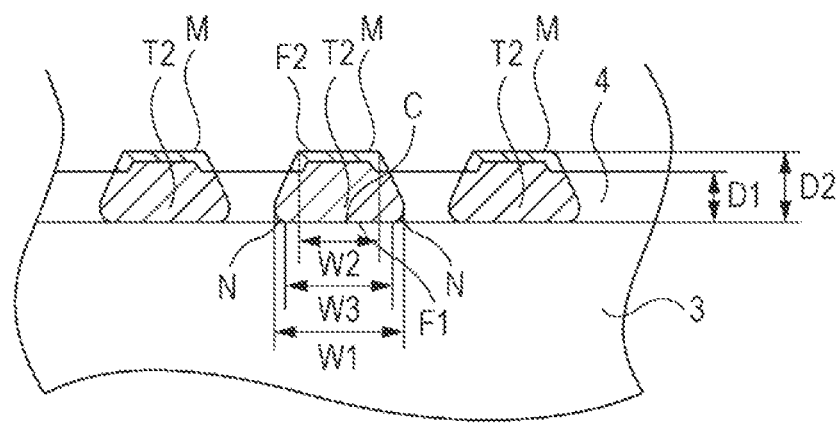

FIG. 11 is a top view (Mont face side) of a wiring board 200 according to the second embodiment. FIG. 12 is a partial sectional view of the wiring board 200 taken along the line I-I of FIG. 11. FIG. 13 is a configuration diagram of a connecting terminal T2 on the front face side of the wiring board 200. FIG. 13A is a top view of the connecting terminal T2. FIG. 13B is a sectional view taken along the line II-II of FIG. 13A. A configuration of the wiling board 200 will now be described with reference to FIG. 11 to FIG. 13, wherein the same reference numerals designate corresponding or identical elements with the wiring board 100 described with reference to FIG. 1 to FIG. 3 throughout the embodiments, and the repeated description will be omitted correspondingly.

(Configuration of Front Face Side)

The wiring board 200 includes a lid plating layer 41 that electrically connects to the core conductor layer 21 on the front face side. The lid plating layer 41 and the conductor layer 32 are electrically connected with a filled via 42 while the conductor layer 32 and the conductor layer 34 are electrically connected with a filled via 43. The filled vias 42 and 43 include a via hole 44a and a via conductor 44b filled up inside of the via hole 44a by plating. The buildup layer 3 includes only a connecting terminal T2 (described later) at the outer most layer. The buildup layer 3 does not include a wiring pattern connected at the same layer as the connecting terminal T2 and a solder resist layer that covers the wiring pattern. Here, the resin insulating layers 31 and 33 and the conductor layer 32 constitute a laminated body.

The connecting terminal T2 formed on the front face side of the wiring board 200 is a so-called area bump type of connecting terminal disposed on the entire mounting region for the semiconductor chip. The connecting terminal T2 is a connecting terminal for the semiconductor chip. By electrical connection with the connecting terminal T2, the semiconductor chip is mounted on the wiring board 200. Each connecting terminal T2 has a rough surface to improve an adhesive property with the filling member 4. The surfaces of the connecting terminal T2 can be roughened, for example, by processing using etchant, such as MEC-Etch-Bond (which is manufactured by MEC Company Ltd.).

As illustrated in FIG. 13, the cross section of each connecting terminal T2 has a trapezoidal shape here the width W1 is wider than the width W2. The width W1 is the width of the first principal surface F1 on the side contacting the laminated body constituted by the resin insulating layers 31 and 33 and the conductor layer 32. The width W2 is the width of the second principal surface F2 facing the first principal surface F1. The first principal surface F1 of the connecting terminal T2 includes the contact surface C, which contacts the laminated body, and the spaced surfaces N. The spaced surfaces N are disposed at both ends of the contact surface C and do not contact the laminated body. The width W3 of the contact surface C is wider than the width W2 of the second principal surface F2.

Furthermore, the exposed surface of the connecting terminal T2 is covered with the metal plating layer M. When mounting the semiconductor chip to the wiring board 200, the connecting terminal of the semiconductor chip and the connecting terminal T2 are electrically connected by reflowing the solder coated on the connecting terminal of the semiconductor chip. Instead of the metal plating layer M, a solder may be coated, or a rustproof OSP process may be performed.

The metal plating layer M is formed on the connecting terminal T2 as follows. The exposed surface of the connecting terminal T2 is etched using, for example, sodium persulfate. Afterwards, the metal plating layer M is formed on the exposed surface of the connecting terminal T2 by performing electroless reduction plating using a reducing agent. In etching using, for example, sodium persulfate, a step is formed around the principal surface of the connecting terminal T2. In the case where the metal plating layer M is formed on the exposed surface of the connecting terminal T2 by the electroless substitution plating, the metal on the exposed surface of the connecting terminal T2 is substituted, thus forming the metal plating layer M. In view of this, even if the exposed surface of the connecting terminal T2 is not etched using, for example, sodium persulfate, the step is formed around the principal surface of the connecting terminal T2.

The plurality of connecting terminals T2 of the wiring board 200 projects from the resin insulating layer 33, and the surface and the side surfaces of the connecting terminals T2 are exposed. In view of this, similarly to the connecting terminal T1 of the wiring board 100, the filling member 4 which is an insulating member is filled up between the connection terminal. The thickness D1 of the filling member 4 is thinner than the thickness (height) D2 of the meeting terminal T2. The filling member 4 can be filled up between the connecting tern terminals T2 by the first to the fourth filling up methods described in the first embodiment.

(Configuration of Reverse Face Side)

The wiring board 200 includes a lid plating layer 141 that electrically connects to the core conductor layer 22 on the reverse face side. The lid plating layer 141 and the conductor layer 132 are electrically connected with a filled via 142 while the conductor layer 132 and the conductor layer 134 are electrically connected with a filled via 143. The filled vias 142 and 143 include a via hole 144a and a via conductor 144b filled up inside of the via hole 144a by plating.

As described above, in the ring board 200 according to the second embodiment, the cross section of each connecting terminal T2 has a trapezoidal shape where the width W1 is wider than the width W2. The width WI is the width of the first principal surface F1 on the side contacting the laminated body constituted by the resin insulating layers 31 and 33 and the conductor layer 32. The width W2 is the width of the second principal surface F2 facing the first principal surface F1. The wiring board 200 according to the second embodiment has the same effects as the effects of the wiring board 100 according to the first embodiment.

(Third Embodiment)

Figure 14:
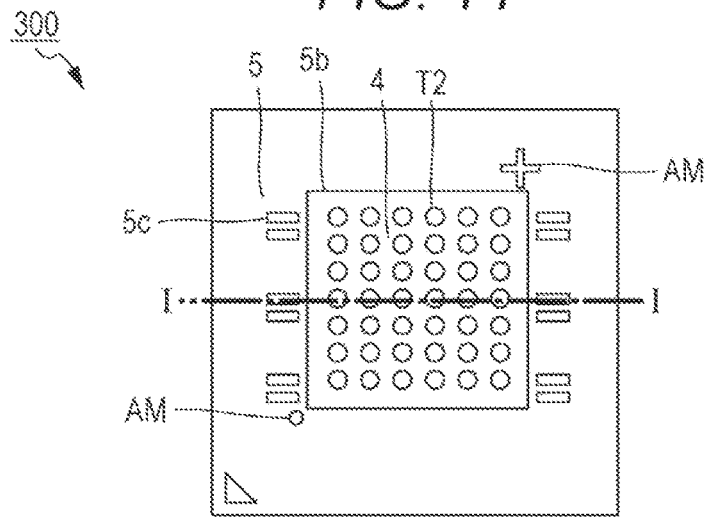
FIG. 14 is a top view (front face side) of a wiring board according to a third embodiment.
Figure 15:
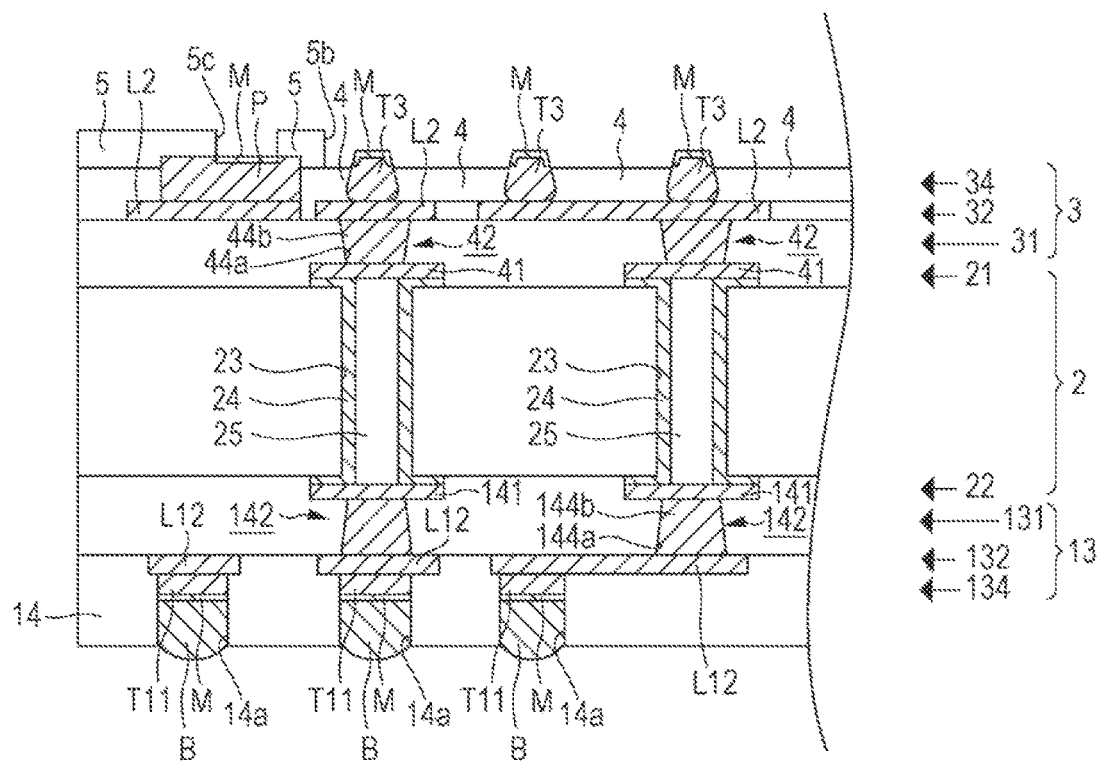
FIG. 15 is a partial sectional view of the wiring board according to the third embodiment.
Figure 16:
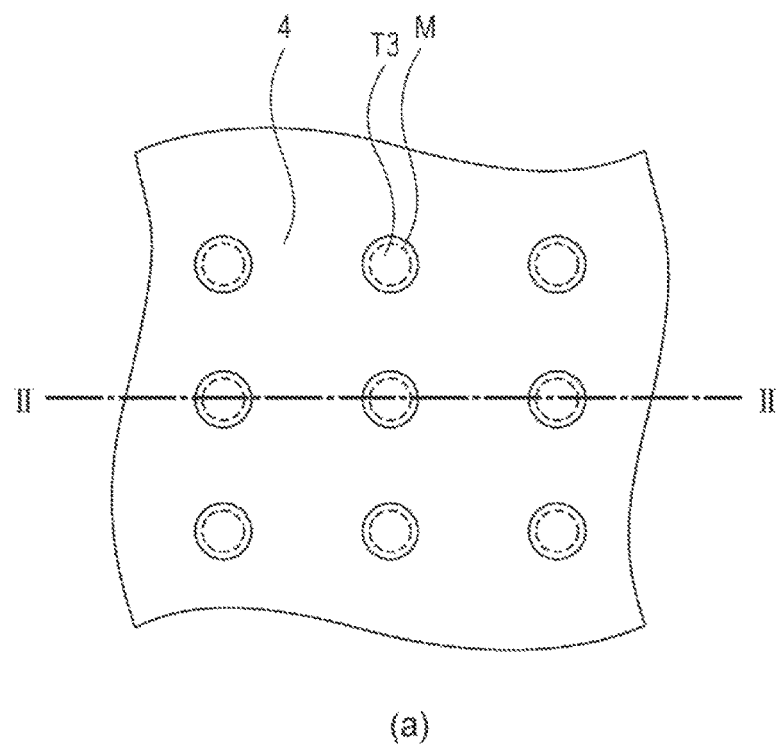
FIG. 16 is a configuration diagram of a connecting terminal on the front face side of the wiring board according to the third embodiment.
Figure 16:
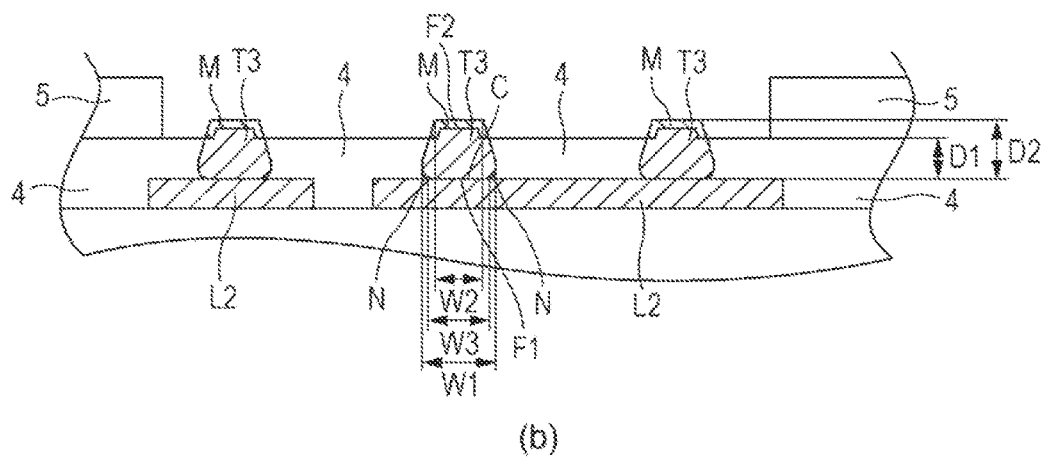

FIG. 14 is a top view (front face side) of a wiring board 300 according to a third embodiment. FIG. 15 is a partial sectional view of the wiring board 300 taken along the line I-I of FIG. 14. FIG. 16 is a configuration diagram of a connecting terminal T3 on the front face side of the wiring board 300. FIG. 16A is a top view of the connecting terminal T3. FIG. 16B is a sectional view taken along the line II-II of FIG. 16A.

The wiring board 300 according to the third embodiment differs from the wiring board 200 described with reference to FIG. 11 to FIG. 13 in that the connecting terminals T3 and T11 are directly formed on the conductor layers 32 and 132 without through vias. A configuration of the wiring board 300 will now be described with reference to FIG. 14 to FIG. 16, wherein the same reference numerals designate corresponding or identical elements with the wiring board 100 described with reference to FIG. 1 to FIG. 3 and the wiring board 200 described with reference to FIG. 11 to FIG. 13 throughout the embodiments, and the repeated description will be omitted correspondingly.

(Configuration of Front Surface Side)

The wiring board 30C) includes the lid plating layer 41 that electrically connects to the core conductor layer 21 on the front surface side. The lid plating layer 41 and the conductor layer 32 are electrically connected with the filled via 42. The filled via 42 includes the via hole 44a and the via conductor 44b filled up inside of the via hole 44a by plating.

The connecting terminals T3 formed on the conductor layer 32 of the g board 300 are disposed at approximately equal spacing and in a grid pattern on the entire mounting region for the semiconductor chip. The connecting terminal T3 has a pillar shape (for example, a column, a quadratic prism, and a triangular prism). The connecting terminal T3 is directly formed on the conductor layers 32, without through a via with the top portion projecting from the surface of the filling member 4. The connecting terminal T3 is a connecting terminal for the semiconductor chip. By electrical connection with the connecting terminal T3, the semiconductor chip is mounted on the wiring board 300. Each connecting terminal T3 has a rough surface to improve an adhesive property with the filling member 4. The surfaces of the connecting terminal T3 is processed, for example, using etchant, such as MEC-Etch-Bond (which is manufactured by MEC Company Ltd.).

As illustrated in FIG. 16, the cross section of each connecting terminal T3 has a trapezoidal shape where the width W1 is wider than the width W2. The width W1 is the width of the first principal surface F1 on the side contacting the laminated body constituted by the resin insulating layers 31 and 33 and the conductor layer 32. The width W2 is the width of the second principal surface F2 facing the first principal surface F1. The first principal surface F1 of the connecting terminal T2 includes the contact surface C, which contacts the laminated body, and the spaced surfaces N. The spaced surfaces N are disposed at both ends of the contact surface C and do not contact the laminated body. The width W3 of the contact surface C is wider than the width W2 of the second principal surface F2.

The exposed surface of each connecting terminal T3 is covered with the metal plating layer M. When mounting the semiconductor chip to the wiring board 300, the connecting terminal of the semiconductor chip and the connecting terminal T3 are electrically connected by reflowing the solder coated on the connecting terminal of the semiconductor chip. The metal plating layer M is constituted of, for example, a single layer selected from metal layers such as a Ni layer, a Sn layer, an Ag layer, a Pd layer, and an Au layer, or a plurality of layers (for example, Ni layer/Au layer and Ni layer/Pd layer/Au layer).

Instead of the metal plating layer M, a rustproof Organic Solderability Preservative (OSP) process may be performed. A solder may be coated on the exposed surface of the connecting terminal T3. Furthermore, after covering the exposed surface of the connecting terminal T3 with the metal plating layer M, the metal plating layer M may be coated with the solder. A method for coating the solder on the exposed surface of the connecting terminal T3 is described in the first embodiment, and the repeated description will be omitted correspondingly.

The filling member 4 is filled up between the connecting terminals T3 while contacting the side surface of each connecting terminal T3 formed on the surface layer of the buildup layer 3. The thickness D1 of the filling member 4 is thinner than the thickness (height) D2 of the connecting terminal T3. The filling member 4 can be filled up between the connecting terminals T3 by the first to the fourth filling up methods described in the first embodiment.

The solder resist layer 5 includes an opening 5b and an opening 5c. The opening 5b exposes the connecting terminals T3 disposed at approximately equal spacing on the mounting region for the semiconductor chip. The opening 5c exposes a pad P for mounting a chip capacitor. The opening 5b of the solder resist layer 5 forms an NSMD shape where the plurality of connecting terminals T3 are disposed in the same opening. An alignment mark AM is formed on the solder resist layer S.

(Configuration of Reverse Face Side)

The wiring board 300 has a configuration that includes the lid plating layer 141 that electrically connects to the core conductor layer 22 on the reverse face side. The lid plating layer 141 and the conductor layer 132 are electrically connected with the filled via 142. The filled via 142 includes the via hole 144a and the via conductor 144b filled up inside of the via hole 144a by plating. The connecting terminal T11 for connection to a motherboard or a similar member (not shown) is directly formed on the conductor layer 132 without through a via.

(Method for Fabricating Wiring Board)

Figure 17:
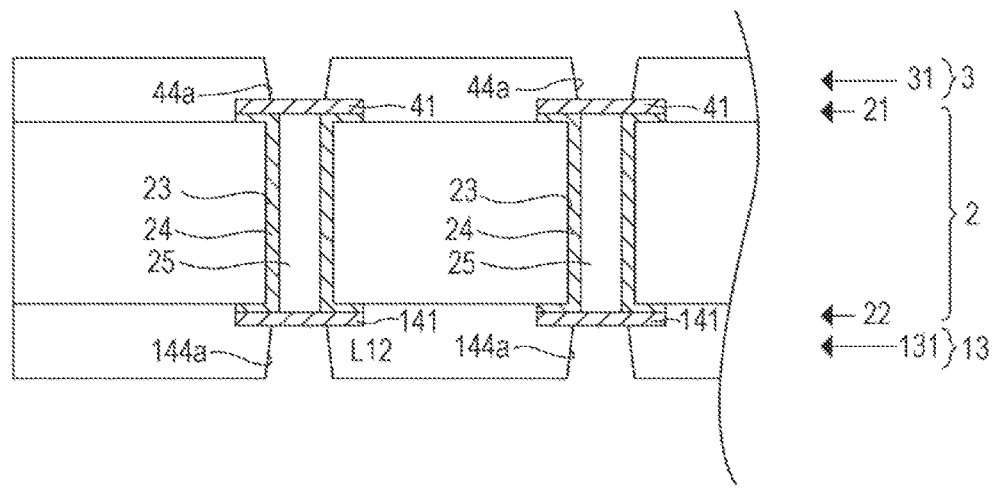
FIG. 17 is a process drawing for fabricating the wiring board according to the third embodiment (buildup process).
Figure 17:
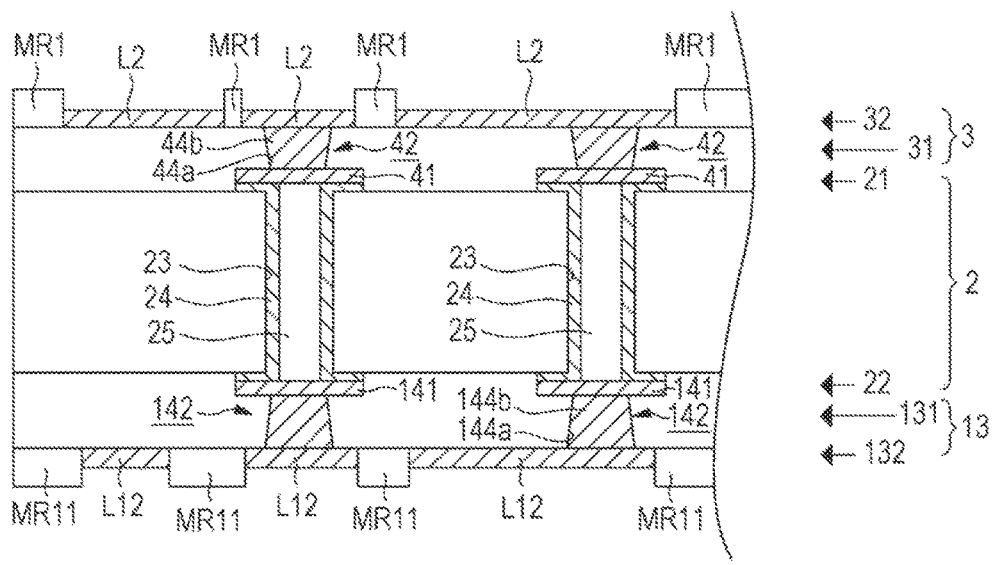
Figure 18:
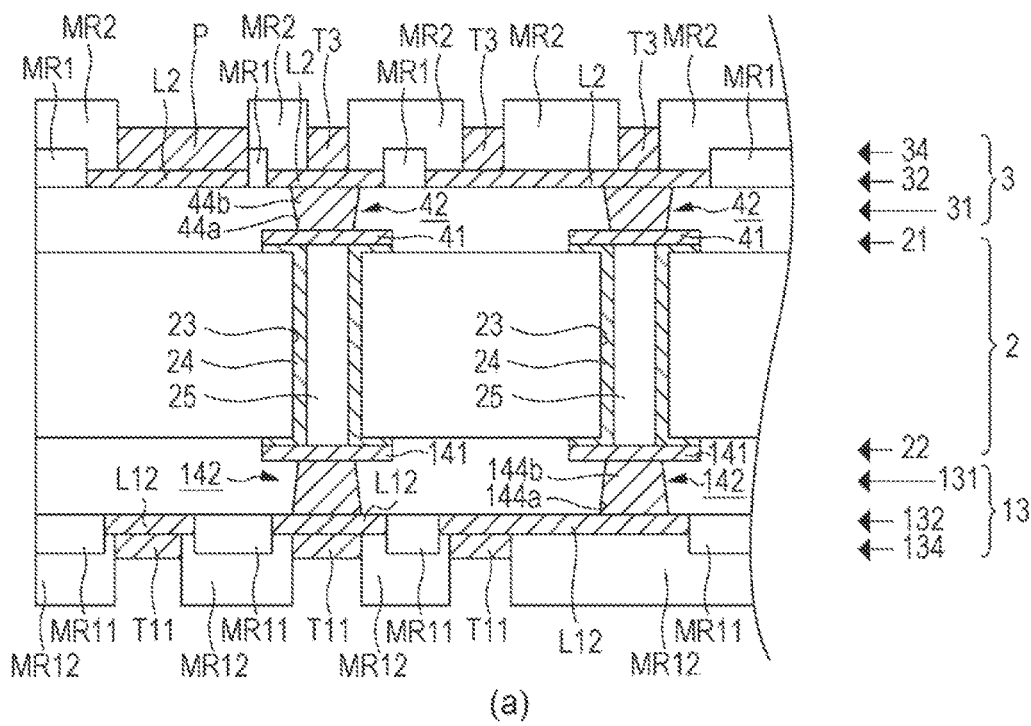
FIG. 18 is a process drawing for fabricating the wiring board according to the third embodiment (projecting plating layer formation process).
Figure 18:
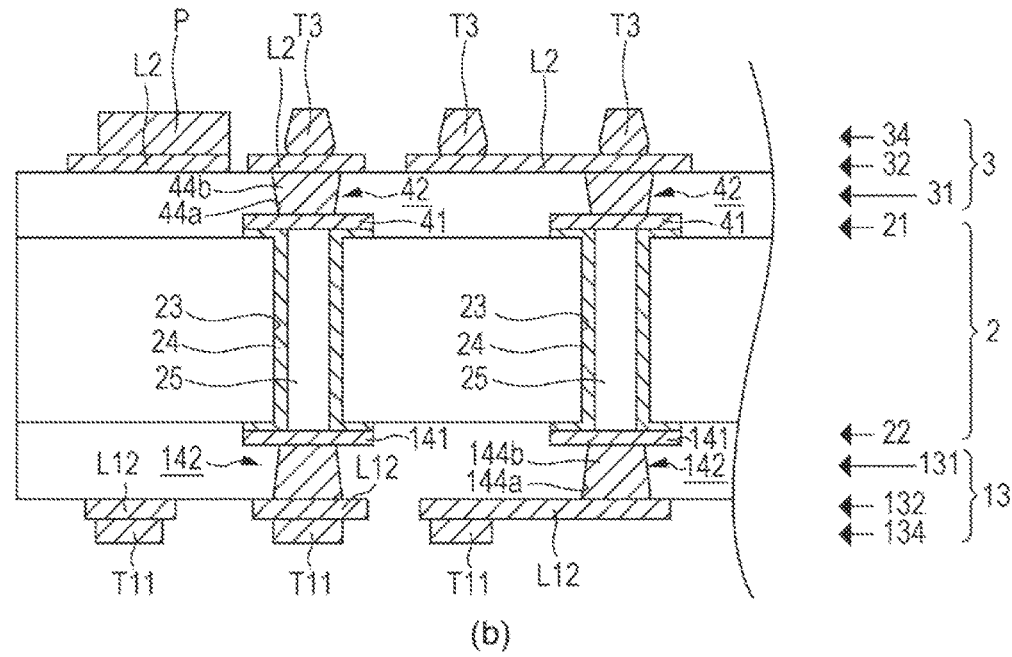

FIG. 17 and FIG. 18 are process drawings for fabricating the wiring board 300 according to the third embodiment. The following describes methods for fabricating the g board 300 with reference to FIG. 17 and FIG. 18. Since a core substrate process, a filling up process, a solder resist layer process, a plating process, and a back-end process are the same as the methods for fabricating the wiring board 100 according to the first embodiment described with reference to FIG. 4 and FIG. 7 to FIG. 10, respectively, the repeated description will be omitted correspondingly.

(Buildup Process: FIG. 17)

Film insulating resin materials having main constituent of epoxy resin are disposed overlapping with one another on the front face and the reverse face of the core substrate 2 to form the resin insulating layers 31 and 131. Then, this laminated product is pressed and heated with a vacuum thermocompression bonding machine, and the film insulating resin materials are press-bonded with heat hardening. Next, laser irradiation is performed using a conventionally well-known laser processing apparatus to form the via holes 44a and 144a in the respective resin insulating layers 31 and 131 (see FIG. 17A).

Subsequently, after roughening the surfaces of the resin insulating layers 31 and 131, electroless copper plating is performed to form electroless copper plating layers on the resin insulating layers 31 and 131 including the inner walls of the via holes 44a and 144a. Next, a photoresist is laminated on the electroless copper plating layers formed on the resin insulating layers 31 and 131 and then is exposed and developed to form desired-shaped plating resists MR1 and MR11. Afterwards, using the plating resists MR1 and MR11 as a mask, the copper is plated by electrolytic plating to obtain a desired copper plating pattern (see FIG. 17B).

(Projecting Plating Layer Formation Process: FIG. 18)

Next, a photoresist is laminated on the electroless copper plating layers formed on the resin insulating layers 31 and 131 without peeling off the plating resists MR1 and MR11, and then is exposed and developed to form desired-shaped plating resists MR2 and MR12. Afterwards, using the plating resists MR2 and MR12 as a mask, the copper plated by electrolytic plating to obtain a desired copper plating pattern (see FIG. 18A).

Next, the plating resists MR1, MR2, MR11, and MR12 are peeled off and the electroless copper plating layers present beneath the plating resists MR1 and MR2 are removed. Thus, the conductor layer 34 that includes the connecting terminal T3 and the pad P is formed on the conductor layer 32 while the conductor layer 134 that includes the connecting terminal T11 is formed on the conductor layer 132 (see FIG. 18B).

As described above, in the wiring board 300 according to the third embodiment, the connecting terminals T3 and T11 are directly formed on the conductor layers 32 and 132 without through vias. In view of this, fabrication processes for the wiring board 300 can be reduced, thus the production cost is reduced. The pillar-shaped connecting terminals T3 are projected from the surface of the filling member 4, thus the connecting terminals T3 can be disposed on the mounting region for the semiconductor chip at high density. As for other effects, the wiring board 300 according to the third embodiment has the same effects as the effects of the wiring board 100 according to the first embodiment and the wiring board 200 according to the second embodiment.

(Another Embodiment)

Figure 19:
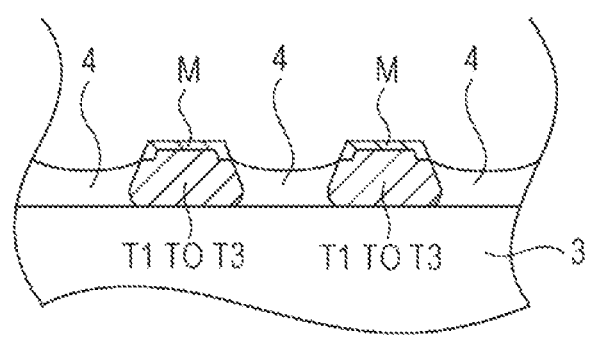
FIG. 19 illustrates a top surface shape of a filling member of the wiring board according to another embodiment.

In the wiring board 100 described with reference to FIG. 1 to FIG. 3, the wiring board 200 described with reference to FIG. 11 to FIG. 13, and the wiring board 300 described with reference to FIG. 14 to FIG. 16, the top surfaces of the filling members 4 to be filled up between the respective connecting terminals T1 to T3 are flat. However, the top surface of the filling member 4 is not necessarily to be a flat. The filling member 4 may form a so-called fillet shape with a rounded top surface as shown in FIG. 19, for example.

Although the present invention has been described in detail above with reference to the specific embodiments, the present invention is not limited to the above embodiments. Various modification and variation of the embodiments described above will occur without departing from the scope of the present invention. In the above-described specific example, for example, an embodiment where the wiring boards 100, 200, 300 are BGA substrates that connect to a motherboard or a similar member via the solder ball B is described. However, the wiring boards 100, 200, 300 may connect to the motherboard or a similar member as a so-called Pin Grid Array (PGA) substrate or a Land Grid Array (LGA) substrate where a pin or a land is disposed instead of the solder ball B.

In this embodiment, in the case where the first filling up method and the second filling up method are adopted, the filling member 4 is formed and then the solder resist layer 5 is formed. However, the filling member 4 may be formed after formation of the solder resist layer 5.

DESCRIPTION OF REFERENCE SIGNS 100, 200, 300 wiring board
2 core substrate
3 buildup layer
4 filling member
5 solder resist layer
5a opening
13 buildup layer
14 solder resist layer
14a opening
21, 22 core conductor layer
23 through-hole
24 through-hole conductor
25 resin-made plug
31, 33 resin insulating layer
32, 34 conductor layer
35, 36 via 37a via, hole
37b via conductor
37c via pad
37d via land
41 lid plating layer
42, 43 filled via
44a via hole
44b via conductor
131 133 resin insulating layer
132, 134 conductor layer
135, 136 via
137a via hole
137b via, conductor
137c via pad
137d via land
141 lid plating layer
142, 143 filled via
144a via hole
144b via conductor
B solder ball
F1 first principal surface
F2 second principal surface
L1, L2, L3 metal wiring
L11, L12 metal wiring
M metal plating layer
T1 to T3, T11 connecting terminal
C contact surface
N spaced surface
AM alignment mark
P pad
MR1, MR2, MR11, MR12 plating resist
W1 to W6 width

The invention claimed is:

1. A wiring board with a laminated body where one or more layer of each of an insulating layer and a conductor layer are laminated, the wiring board comprising:
   a plurality of connecting terminals formed separately from one another on the laminated body; and
   a filling member filled up between the plurality of connecting terminals, the filling member being filled up to a position lower than a height of the plurality of connecting terminals, wherein
   the connecting terminals have a cross section with a trapezoidal shape where a width of a first principal surface on a side contacting the laminated body is wider than a width of a second principal surface facing the first principal surface,
   a solder resist layer having an opening that exposes the plurality of connecting terminals and covering a wiring pattern connected to the plurality of connecting terminals, is provided on the laminate body,
   the wiring pattern has a cross section with a trapezoidal shape where a width of a third principal surface on a side contacting the laminated body is wider than a width of a fourth principal surface facing the third principal surface, and
   at least a part of the plurality of connecting terminals has a ratio of a width of the first principal surface with respect to a width of the second principal surface larger than a ratio of a width of the third principal surface with respect to a width of the fourth principal surface of the wiring pattern.

2. The wiring board according to claim 1, wherein
the connecting terminals have the first principal surface that includes a contact surface and spaced surfaces, the contact surface contacting the laminated body, the spaced surfaces being disposed on both ends of the contact surface and not in contact with the laminated body.

3. The wiring board according to claim 1, wherein
the contact surface has a width wider than a width of the second principal surface.

4. The wiring board according to claim 1, wherein
the filling member functions as a solder resist.

* * * * *